United States Patent
Madocks et al.

(10) Patent No.: US 10,273,570 B2
(45) Date of Patent: Apr. 30, 2019

(54) ROTARY MAGNETRON MAGNET BAR AND APPARATUS CONTAINING THE SAME FOR HIGH TARGET UTILIZATION

(71) Applicant: General Plasma Inc., Tucson, AZ (US)

(72) Inventors: John E. Madocks, Ashfield, MA (US); Patrick Lawrence Morse, Tucson, AZ (US); Phong Ngo, Tucson, AZ (US)

(73) Assignee: General Plasma, Inc., Tucson, AZ (US)

( * ) Notice: Subject to any disclaimer, the term of this patent is extended or adjusted under 35 U.S.C. 154(b) by 163 days.

(21) Appl. No.: 15/180,289

(22) Filed: Jun. 13, 2016

(65) Prior Publication Data

US 2016/0289820 A1 Oct. 6, 2016

Related U.S. Application Data

(62) Division of application No. 13/504,366, filed as application No. PCT/US2010/054111 on Oct. 26, 2010, now Pat. No. 9,388,490.

(Continued)

(51) Int. Cl.
*C23C 14/54* (2006.01)
*C23C 14/34* (2006.01)
(Continued)

(52) U.S. Cl.
CPC .......... *C23C 14/54* (2013.01); *C23C 14/3407* (2013.01); *C23C 14/35* (2013.01);
(Continued)

(58) Field of Classification Search
CPC .. C23C 14/35; C23C 14/3407; H01J 37/3405; H01J 37/342; H01J 37/3452; H01J 37/3482
(Continued)

(56) References Cited

U.S. PATENT DOCUMENTS 4,407,713 A 10/1983 Zega
4,445,997 A 5/1984 McKelvey
(Continued)

FOREIGN PATENT DOCUMENTS

| WO | 1991007521 | 5/1991 |
| WO | 03/015124 | 2/2003 |
| WO | 2007051105 | 5/2007 |

OTHER PUBLICATIONS

PCT International Search Report and Written Opinion dated Jul. 1, 2011, issued in PCT Patent Application No. PCT/US2010/054111, 10 pages.

*Primary Examiner* — Rodney G McDonald
(74) *Attorney, Agent, or Firm* — Grossman Tucker Perreault & Pfleger PLLC

(57) ABSTRACT

An apparatus for coating a substrate is provided that includes a racetrack-shaped plasma source having two straight portions and at least one terminal turnaround portion connecting said straight portions. A tubular target formed of a target material that forms a component of the coating has an end. The target is in proximity to the plasma source for sputtering of the target material. The target is secured to a tubular backing cathode, with both being rotatable about a central axis. A set of magnets are arranged inside the cathode to move an erosion zone aligned with the terminal turnaround toward the end of the target as the target is utilized to deposit the coating on the substrate. Target utilization of up to 87 weight percent the initial target weight is achieved.

4 Claims, 4 Drawing Sheets

Related U.S. Application Data

(60) Provisional application No. 61/254,983, filed on Oct. 26, 2009.

(51) Int. Cl.
*C23C 14/35* (2006.01)
*H01J 37/34* (2006.01)

(52) U.S. Cl.
CPC ........ *H01J 37/342* (2013.01); *H01J 37/3405* (2013.01); *H01J 37/3452* (2013.01); *H01J 37/3482* (2013.01); *H01J 2237/24585* (2013.01); *H01J 2237/332* (2013.01)

(58) Field of Classification Search
USPC ............. 204/192.12, 298.12, 298.21, 298.22
See application file for complete search history.

(56) References Cited

U.S. PATENT DOCUMENTS

| | | | |
|---|---|---|---|
| 4,446,877 A | 5/1984 | Aikman | |
| 4,714,536 A | 12/1987 | Freeman et al. | |
| 4,892,633 A | 1/1990 | Welty | |
| 4,943,361 A | 7/1990 | Kakehi et al. | |
| 5,047,131 A | 9/1991 | Wolfe et al. | |
| 5,069,772 A | 12/1991 | Fritsche et al. | |
| 5,096,562 A | 3/1992 | Boozenny et al. | |
| 5,100,527 A | 3/1992 | Stevenson et al. | |
| 5,130,005 A | 7/1992 | Hurwitt et al. | |
| 5,174,880 A | 12/1992 | Bourez et al. | |
| 5,188,717 A | 2/1993 | Broadbent et al. | |
| 5,213,672 A | 5/1993 | Hartig et al. | |
| 5,338,422 A | 8/1994 | Belkind et al. | |
| 5,364,518 A | 11/1994 | Hartig et al. | |
| 5,382,344 A | 1/1995 | Hosokawa et al. | |
| 5,399,253 A | 3/1995 | Grünenfelder | |
| 5,417,833 A | 5/1995 | Harra et al. | |
| 5,445,721 A | 8/1995 | Bower | |
| 5,470,452 A | 11/1995 | Dickey et al. | |
| 5,518,592 A | 5/1996 | Bower et al. | |
| 5,571,393 A | 11/1996 | Taylor et al. | |
| 5,616,225 A | 4/1997 | Sieck et al. | |
| 5,645,699 A | 7/1997 | Sieck | |
| 5,814,195 A | 9/1998 | Lehan et al. | |
| 5,830,327 A | 11/1998 | Kolenkow | |
| 5,876,576 A | 3/1999 | Fu | |
| 6,264,803 B1 | 7/2001 | Morgan et al. | |
| 6,365,010 B1 | 4/2002 | Hollars | |
| 6,375,814 B1 | 4/2002 | De Bosscher et al. | |
| 6,416,639 B1 | 7/2002 | De Bosscher et al. | |
| 6,488,824 B1 * | 12/2002 | Hollars ................. | C23C 14/35 204/192.12 |
| 6,585,870 B1 * | 7/2003 | Pitcher ................ | C23C 14/3414 204/298.12 |
| 6,736,948 B2 | 5/2004 | Barrett | |
| 6,805,770 B1 | 10/2004 | Oster | |
| 6,841,051 B2 | 1/2005 | Crowley | |
| 7,014,741 B2 | 3/2006 | Rietzel et al. | |
| 7,169,271 B2 | 1/2007 | Hong et al. | |
| 7,498,587 B2 | 3/2009 | Welty | |
| 7,513,982 B2 | 4/2009 | Tepman | |
| 7,674,360 B2 | 3/2010 | Hong et al. | |
| 7,807,030 B2 | 10/2010 | Hong et al. | |
| 7,842,355 B2 | 11/2010 | Stowell | |
| 7,993,496 B2 | 8/2011 | Hartig et al. | |
| 8,016,982 B2 | 9/2011 | Yamamoto et al. | |
| 8,123,919 B2 | 2/2012 | Mayer et al. | |
| 8,398,834 B2 | 3/2013 | Hollars | |
| 8,900,428 B2 | 12/2014 | Crowley et al. | |
| 2006/0076231 A1 * | 4/2006 | Wei ....................... | C23C 14/046 204/192.12 |
| 2006/0157346 A1 | 7/2006 | Cnockaert et al. | |
| 2008/0012460 A1 | 1/2008 | Bernick et al. | |
| 2008/0047831 A1 | 2/2008 | Richert et al. | |

\* cited by examiner

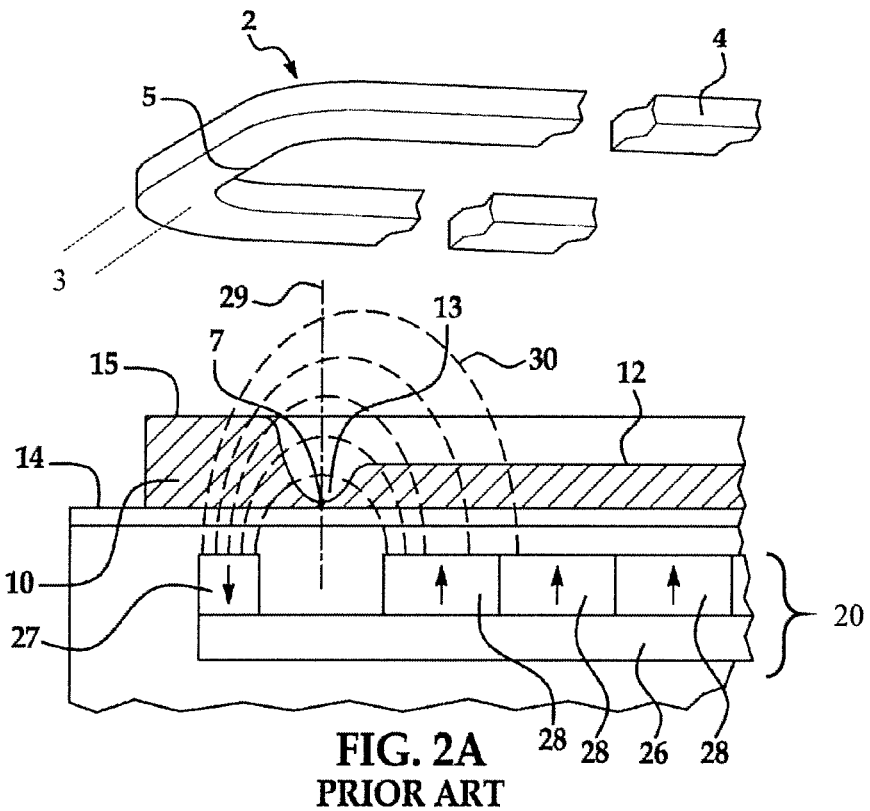
FIG. 2A
PRIOR ART
FIG. 2B
PRIOR ART
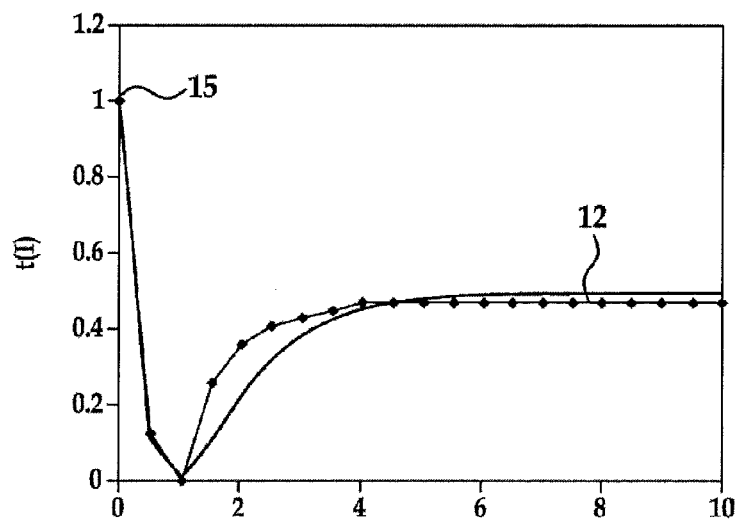

Hartig et al
5,364,518

ROTARY MAGNETRON MAGNET BAR AND APPARATUS CONTAINING THE SAME FOR HIGH TARGET UTILIZATION

RELATED APPLICATIONS

This application claims priority benefit of U.S. Provisional Application Ser. No. 61/254,983 filed 26 Oct., 2009, International Patent Application No. PCT/US2010/054111 filed Oct. 26, 2010 both now expired and U.S. patent application Ser. No. 13/504,366 filed 28 Jun. 2012 now pending; the contents of which are hereby incorporated by reference.

FIELD OF THE INVENTION

The present invention relates in general to rotary sputter magnetrons also called cylindrical magnetrons and in particular to improving the target utilization of these devices.

BACKGROUND

Rotary magnetron sputtering is well known in the art following McKelvey, AS EVIDENCED BY U.S. Pat. No. 4,446,877. FIGS. 1A, 1B, 2A, and 2B show a conventional, prior art rotary magnetron with a sputter racetrack 2 proximal to the outer surface of the target tube cylinder 1. the target cylinder 1 is supported on a backing tube 14. The sputter racetrack 2 generates a plasma region proximal to the target material 10 to induce removal of target material 10 and onto a deposition substrate. As is known, the sputter target material 10 is formed into a target cylinder 1 and the cylinder 1 is rotated on spindle 6 while an internal magnet bar 20 is held stationary within the cylinder 2, as shown in FIG. 2A. The result is a sputter magnetron racetrack 2 of deposition plasma appears on the rotating tube during operation, as best seen in FIG. 1A that is a magnified longitudinal cross sectional view of region IB of FIG. 1A. The racetrack 2 has linear portions 4 and turnaround portions 3. The approximate registry is shown between an interior edge 5 of turnaround portion 3 and the point of maximal target wear 7 and is a result of the differences in plasma density and magnetic electron confinement to which the target material is exposed proximal to turnaround portion 3 relative to linear portions 4. As will be detailed subsequently, the magnetic field generated by the magnet bar is also important in establishing the point of maximal erosion 7. It is appreciated that the opposing end of the target cylinder 1 has a mirror image erosion zone to that shown in the accompanying figures associated with the other end of the racetrack 2. This mirror image zone is not shown for visual clarity yet is otherwise identical in formation and shape to that depicted.

As is known, while considerably better than planar magnetron sputtering, target utilization is only approximately 60% for a typical rotary magnetron. The reason for this is premature target wear of the cylinder 1 in the vicinity of the turnaround 3 of the sputter racetrack 2. This is shown with greater clarity in the FIG. 1B cross-section view. The target cylinder 1 before usage has a surface 15 that defined an initial target thickness. As target tube material 10 is sputtered off the target cylinder 1, the cylinder section 13 proximal to the turnaround portion 3 of the racetrack 2 wears faster than the cylinder section 12 proximal to a straightway portion of the racetrack 2. The operational lifetime of a target tube cylinder 1 is exhausted when the target material is worn through almost to backing tube 14. Sputtering of the backing tube 14 onto the substrate contaminates the deposited film. Due to the faster wear, this occurs at a cylinder section 13 first, leaving considerable target material 10 unusable along straight away section 12 underlying straight portion 4. A conventional solution to this detrimental turnaround wear pattern is the usage of a target with added thickness in the end regions and underlying the turnaround portions 3. Such targets are commonly referred to as "dog-boned". While the thicker dog-boned region improves target utilization, this comes are the cost of more complicated target formation and a larger overall target diameter to the target. The increased separation distance between the target surface and a substrate for coating increases magnetron energy consumption and overall efficiency.

FIG. 2A shows a more detailed longitudinal cross-sectional view proximal to the turnaround portion 3 of a conventional, prior art rotary magnetron racetrack 2 along line of FIG. 1A. The backing tube 14 is shown in partial cutaway for visual clarity. In this cross-sectional view the internal, stationary magnet bar 20 is shown positioned proximal to rotating backing tube 14 and target material 10. A corresponding transverse cross sectional perspective view is shown in FIG. 2B that is taken along line IIB-IIB of FIG. 1A. The internal magnet bar 20 has a magnetic shunt 26 and magnets 27 and 28. The arrows depict the magnetic polarity according to common convention with the arrowhead pointing towards a north pole. The configuration of magnets 27 and 28 and shunt 26 result in magnetic field lines 30 that arch over and through target material 10. The apex of the field lines arching over and through the target is plotted as field line 29. Since, as is known, electrons tend to have concentrated density at the center of the arch, the principal erosion region of cylinder section 13 coincides with along field line 29 when racetrack 2 is generating plasma. This plasma being concentrated in the turnaround portion 3 relative to straight portion 4. In this case, field line 29 is roughly normal to the surface of the cylinder 1. The erosion zone at the at the cylinder portion 13 then is continuously focused over the same linear location at point 7 on the target tube and excessive wear occurs as shown by the worn target profile of cylinder section 13. As shown, the cylinder section 13 is worn to the backing tube 14 at point 7 while substantial target material remains unused along straightaway cylinder section 12, underlying straight portion 4.

Prior art attempts have been made to improve target utilization have met with limited success. One such prior art configuration is depicted in FIG. 3 and teaches away from the present invention. Like numerals used in FIG. 3 have the meaning ascribed thereto with respect to the preceding figures. FIG. 3 shows a cross-sectional view of U.S. Pat. No. 5,364,518. In this patent, the problem of poor target utilization of rotary magnetrons is recognized and the attempts to improve target utilization. FIG. 3 is based on FIG. 7B of U.S. Pat. No. 5,364,518 and the resulting target erosion profile is shown overlaid on this drawing, where a magnetic shunt 120 is added to the side of magnet 107 and shunt 106 to pull magnetic flux toward the end 125 of target tube cylinder 1. This is taught in U.S. Pat. No. 5,364,518 to widen the target erosion region at the turnaround region 13 and improves target utilization. An analysis of the proposed solution shows the apex of the resulting magnetic field lines 130 plotted as line 109. As shown, line 109 is off normal line 131 by angle θ, also referenced as 110. This geometry results in the erosion zone 114 starting out closer to the end of target cylinder 1. As the target cylinder 1 is eroded, the erosion zone follows line 109 and moves away from the end 125 of the target cylinder 1. Unfortunately, this has only a minimal benefit to overall target utilization. By moving the erosion zone 114 progressively toward the straight away section of cylinder 1 and underlying straight portion 4 of racetrack 2 with continued removal of target material 10, the erosion zone moves toward a high erosion region of the target and merely broadens the width of the erosion zone relative to that of FIGS. 1B and 2A.

This broadening is understood with reference to the following equation that approximates the terminal target cross section, t(l) when no further target sputtering can occur without risk of backing tube sputtering:

$$t(l)=D_r(1-e^{k(l-l_f)})^2 \qquad (I)$$

where $D_f$ is the final erosion depth and roughly models the width of the erosion zone with a smaller value of $D_f$ corresponding to a wider erosion zone, l is the lateral position and $l_f$ is the maximal erosion point denoted at 7 in the aforementioned drawings, and k is a fitting constant.

The approximate fit of equation (I) onto a conventional erosion profile of FIG. 2A is shown graphically as a dashed line in FIG. 2C. For a noimalized erosion profile where the initial target thickness is a unitless value of 1 and point 7 is at l=1, the depicted fit corresponds to two parameter fit for $D_f=0.48$ and $l_f=0.88$, where k=1. It is appreciated that the erosion profile of FIG. 3 is similarly fit with this expression with a best two parameter for $D_f=0.40$ and $l_f=0.96$, where k=1.

Thus, there exists a need for a magnet bar and an apparatus including the same that provides more efficient target utilization for rotary magnetrons. There further exists a need for moving the erosion zone away from the straight-away region of a proximal racetrack to afford an improvement in target utilization.

SUMMARY OF THE INVENTION

An apparatus for coating a substrate is provided that includes a racetrack-shaped plasma source having two straight portions and at least one terminal turnaround portion connecting said straight portions. A tubular target formed of a target material that forms a component of the coating has an end. The target is in proximity to the plasma source for sputtering of the target material. The target is secured to a tubular backing cathode, with both being rotatable about a central axis. A set of magnets are arranged inside the cathode to move an erosion zone aligned with the terminal turnaround toward the end of the target as the target is utilized to deposit the coating on the substrate. Target utilization of up to 87 weight percent the initial target weight is achieved.

A process of coating a substrate includes energizing a tubular target under conditions to generate a sputtering racetrack-shaped plasma extending towards the substrate. The target is formed of a tube material and has a tube end and is affixed to a tubular cathode that forms a tube backing Magnets inside the cathode create a magnetic field which interacts with a racetrack-shaped plasma source aligned with the target. The plasma source has two straight portions and at least one terminal turnaround portion connecting the straight portions to move an erosion zone on the tubular target toward the end of the target as the target is utilized to deposit the coating on the substrate. The tube end being aligned with at the least one terminal turnaround of the plasma source. A spent rotary magnetron target is thereby produced having a straightaway portion that intersects the end at said erosion zone at an angle β of between 70 and 90 degrees and has lost between 70 and 87 weight percent the initial weight.

BRIEF DESCRIPTION OF THE DRAWINGS

FIG. 2A shows a more detailed prior art longitudinal cross sectional view magnified view of target tube erosion profile at the racetrack turnaround rotary magnetron of region IB along line IIA-IIA of FIG. 1A inclusive of the magnetron magnet bar and depicting the field line overlap with the resulting target tube erosion profile;

FIG. 2B shows a prior art perspective transverse cross sectional view along line IIB-IIB of FIG. 1A;

FIG. 2C shows a curve fit of Equation (I) to the erosion zone profile of FIG. 1B;

DETAILED DESCRIPTION OF THE PRESENT INVENTION

The present invention has utility as rotary magnetron with higher weight percentage target utilization than has been heretofor obtainable. This is achieved by changing the magnetic field apex as a function of operational time from a position over the original target surface so that as the target tube erodes, the magnetic field apex shifts toward the end of the target cylinder thereby shifting the target erosion zone outward toward the end of the target tube to form a more stepped and outwardly shifted erosion zone. The present invention is premised on the realization that the target tube material at the end of the target cylinder more efficiently uses tube material compared to the prior art. By shifting the erosion zone toward the end of the target tube cylinder through the inclusion of an intermediate magnet with a polarity different than that of the distal magnet of a magnet bar assembly adjacent thereto, the tube cylinder zones of maximal erosion are dynamically moved toward the target cylinder ends to achieve an overall target utilization that is improved relative to the prior art. Higher percentage target utilization as a weight percentage is achieved compared to the prior art. The expense and effort associated with dog-boned target cylinders is also precluded.

Figure 4:
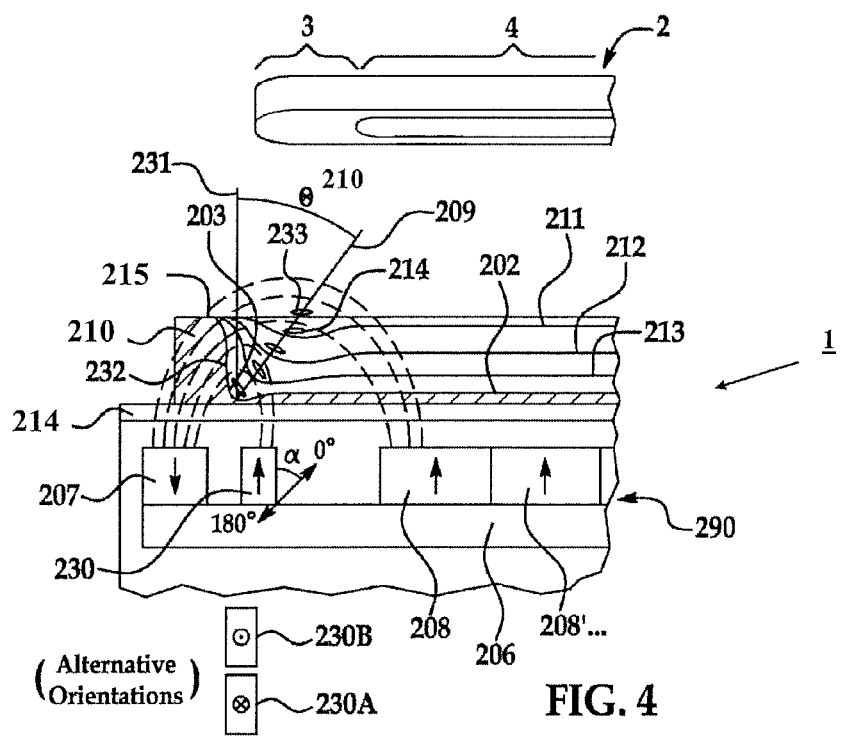
FIG. 4 shows a longitudinal cross sectional view of the racetrack turnaround region of the target and an arrangement of an inventive stationary internal bar magnet with the resulting target profile as a function of time.

A longitudinal cross sectional view of the present invention is shown in FIG. 4 and depicts the target cylinder 1 and the inventive stationary magnet bar shown generally at 200 and underlying the turnaround region 3 of rotary magnetron racetrack 2 that generates plasma during operation. Like numerals in this figure have the meanings ascribed thereto with respect to the preceding figures. Starting with a conventional rotating tube cylinder 1 having a backing tube 14 with target material 10 formed around the backing tube 14. The target surface 15 indicates the starting outer diameter of target tube cylinder 1 with target material 10 maximal extent prior to sputtering. The stationary magnet bar shown generally at 290 has a shunt 206 and magnets 208, 207 and magnet 230. The magnet bar 290 extends to the right as indicated by multiple magnets denoted generally at 208' and underlie straight portions 4 of the racetrack 2. While the magnet bar 290 is depicted as a single row of magnets, it is appreciated that the present invention is also operative with multiple rows of magnets, as for example depicted in FIG. 2 of U.S. Pat. No. 5,364,518.

Figure 1A:
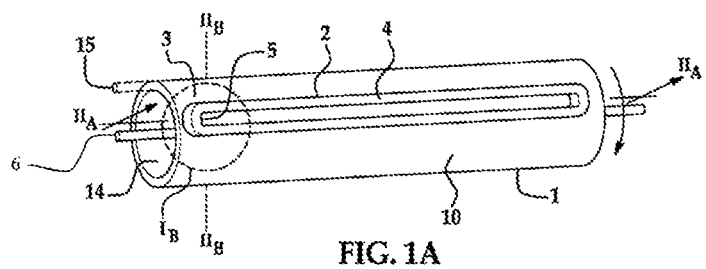
FIG. 1A shows a prior art perspective view of a conventional sputter racetrack on the outside of a rotary magnetron.
Figure 1B:
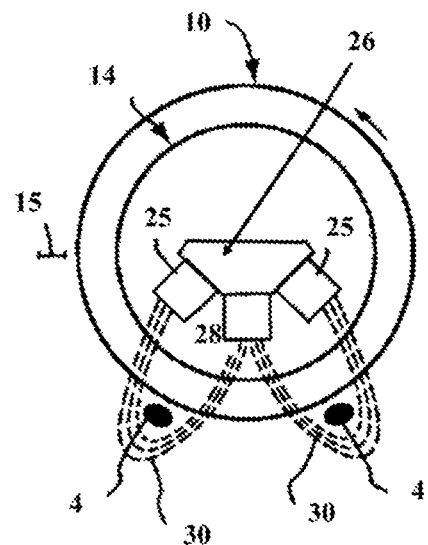
FIG. 1B shows a prior art longitudinal cross sectional magnified view of target tube erosion profile at the racetrack turnaround rotary magnetron of region IB along line of FIG. 1A.
Figure 1C:
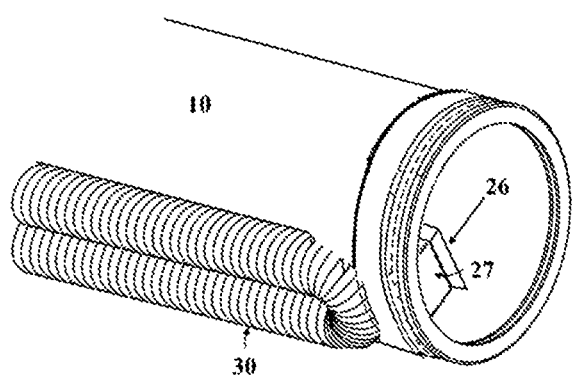
Figure 3:
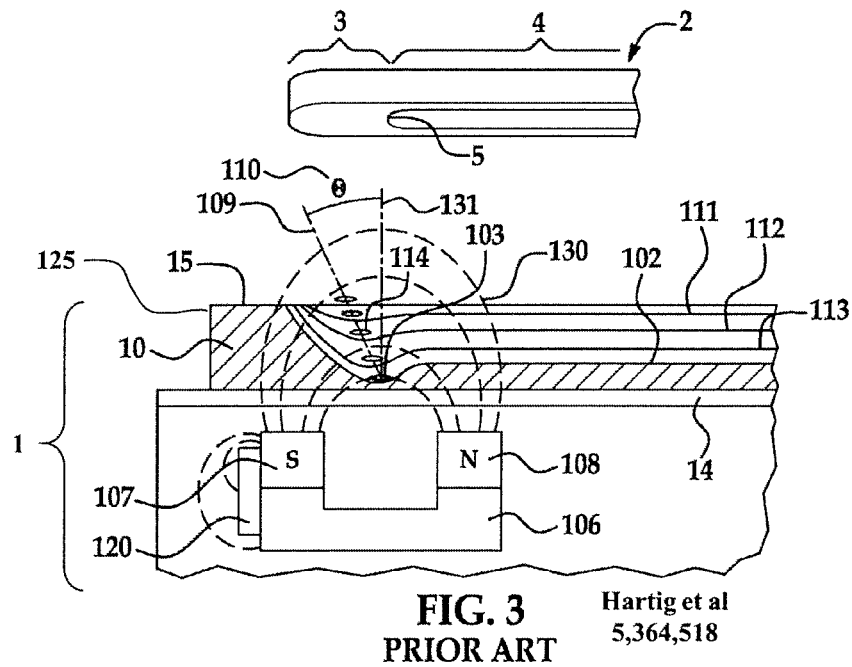
FIG. 3 shows a prior art longitudinal cross sectional view of a a target tube erosion profile for U.S. Pat. No. 5,364,518, FIG. 7B that attempts to limit localized target thinning as shown in the preceding figures.

According to the present invention, the erosion zone 214 is shifted outward towards the end 232 of target tube 1 with the removal of target material 10. This results in the erosion zone 214 being dynamically displaced into the comparatively thicker, target tube end section 232. This is in contrast to the prior art continued wear at the maximal wear region of cylinder section 13 of FIGS. 1 and 2. Through the lateral and angular dynamic shift in the erosion zone 214, overall target utilization is improved compared to the prior art. Target utilization according to the present invention is measured to exceed 70%, 75%, 80%, 85%, and as much as 87% of the initial weight of the target material 10. This compares to approximately 60% of the initial weight of the target material 10 being usable for conventional systems including that of U.S. Pat. No. 5,364,518. Aluminum and aluminum alloys are merely representative of target materials 10 from which a target cylinder 1 is formed.

Dynamic shifting of the erosion zone 214 is accomplished with the configuration of magnets: distal magnet 207, proximal magnet 208 and intermediate magnet 230. The magnets 207, 208, 208', and 230 are each independently a bar magnet, or an electromagnet. The placement of an intermediate magnet 230 pulls field lines from distal magnet 207 and causes the magnetic field apex line 209 to shift away from normal line 231 by angle θ, also referenced with numeral 210 as the target material 10 is removed by plasma sputtering. It is appreciated that placement of intermediate magnet 230 spaced apart synonymously, referred to as non-contiguous with magnets 207 or 208 affords certain advantages in adjusting magnetic field lines extending through the target material. The placement of intermediate magnet 230 distal of the interior edge 5 of turnaround portion 3 is preferred to shift the erosion zone toward the tube end, as shown in FIG. 4. According to the present invention, the angle θ dynamically changes from 0 at line 231 through an angle θ of up to 70 degrees, as measured the direction orthogonal to the lowest point of erosion at profile 202. Factors relevant in achieving the value of θ at terminal profile 202 include the thickness and identity of target cylinder 1, magnetic strength and relative spacing of magnets 207, 230, 208, and 208', magnetic permeability of target material 10, and relative dimensions and operating conditions for the racetrack 2. A typical 1 meter long aluminum taget cylinder used under industrial deposition conditions has θ values that shift between 0 and 50 degrees while the erosion zone for such a target typically shifts toward end 232 from 0.5 to 5 centimeters.

As the apex line 209 moves closer to the end 232 of target tube 10, as the target material 10 is removed by sputtering, the result of this magnetic field configuration is shown in the series of dynamic successive erosion profiles 211, 212, 213 and 202. Initially, the magnetic field apex 209 is positioned over the original target surface 15 and results in the erosion zone at 233. As the target tube erodes, the apex shifts toward the end 232 of the target cylinder 1 and consequently the target erosion zone 214 also moves toward the end 232 of the target cylinder 1. As is shown, as the apex line shifts, the erosion zone moves onto the side of the target tube 232. This slows the erosion at the bottom of the target and extends target utilization percentage and therefore operational lifetime.

Figure 5A:
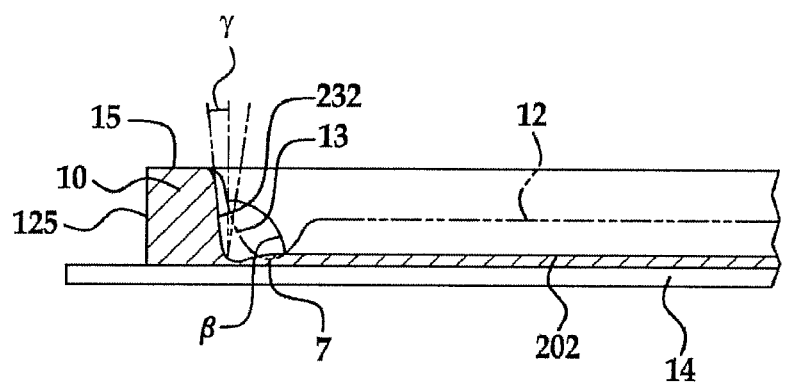
FIG. 5A shows a longitudinal cross sectional view the prior art target utilization terminal profile (dashed) as an overlay of the inventive target utilization terminal profile.

FIG. 5A shows a comparison of rotary target wear between the prior art and the present invention. The prior art wear profile is shown as a dashed line 13 corresponding to region 13 of FIG. 1B. Minimal point 7 is the prior art wear point underlying the turnaround portion 3 that causes premature target end of life. The deep wear at 7 leaves unusable material 12 underlying the straight portion 4 of the plasma generator racetrack 2 extending linearly to the right as depicted in FIG. 5A and parallel above the backing tube 14. In the present invention, a superior material utilization wear profile achieved. At the end of the target life, the straight away material 202 is worn down almost to backing tube 14. The end 232 forms a flange intersection with the adjacent erosion zone 202 and at an angle β of greater than 50, 55, 60, 65, 70, 75, 80, 85 and almost 90 degrees at the end of an operable lifetime for the target cylinder 1. The angle β is measured by extrapolating the intersection of a line orthogonal to the surface 15 and from the erosion zone 202 less the angle γ between end 232 and the orthogonal line such that β+γ=90 degrees. At the target region underlying the racetrack turnaround portion 3 and well into target usage, the target tube side wall 232 is eroded almost perpendicular to the original tube surface 15.

It is appreciated that greater tube utilization is achieved by a number of magnet configurations. The intermediate magnet is positioned at angle α that has the north polar orientation within 10 degrees of that of proximal magnet 208 (80-110 degrees) or within 10 degrees of orthogonal to both the distal magnet 207 and the proximal magnet 208 (170-190 or 10-350 degrees). With these angular orientations being based on magnet 207 defining and angle of 270 degrees as shown and magnet 208 defining 90 degrees in a plane projecting orthogonal to the plane of the page. For instance, magnet 230 can be laid orthogonal to the position depicted in FIG. 4 on its side with the pole arrow projecting into (0 degrees) or outward of the page plane (180 degrees) so as to be perpendicular to magnet 207 with the angle defined by α in FIG. 4. These alternate orientations are shown in displaced position as 230A and 230B, respectively. It is appreciated that magnets 207 and 208 each is independently and optionally shaped or stacked. A shaped magnetic is defined herein as one that deviates from a rectilinear cuboid. It is appreciated that magnet face shaping proximal to the tube backing 14 is particularly helpful in controlling magnet field shape and strength. A stacked magnet is defined herein as a magnet that is not monolithic and instead formed by combining several distinct magnetic elements in an additive manner.

Figure 5B:
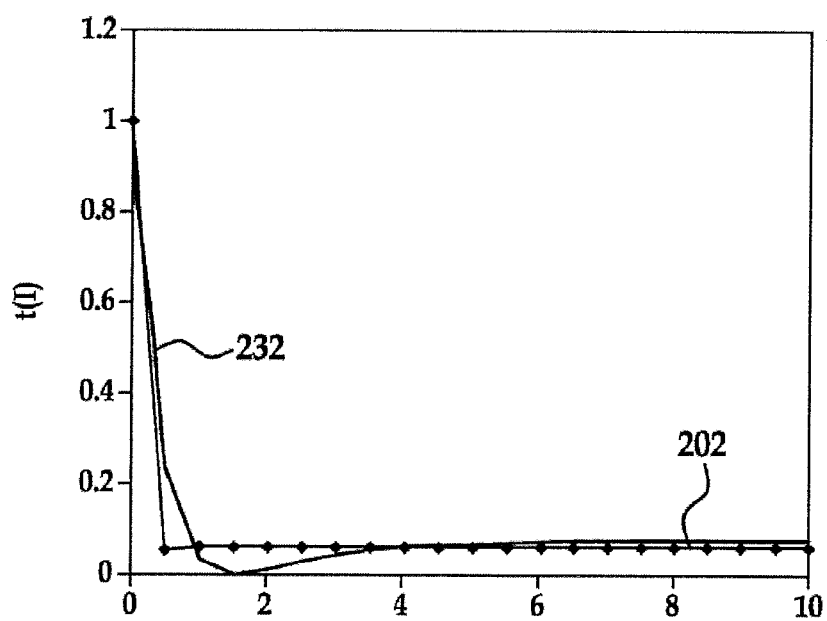
FIG. 5B shows normalized plots of the prior art and inventive target utilization of FIG. 5A with fits thereto using equation (I).

FIG. 5B shows an overlay of the fitting functions onto the normalized terminal erosion zone cross sections of the prior art of FIG. 2C and present invention of FIG. 5A. The best two parameter fit of Equation I to the inventive erosion zone profile occurs with $D_f=0.075$, $k=1$ and $l_f=1.51$, as shown in FIG. 5B. This erosion profile is also readily modeled with a step function, with the location of the step being readily modeled based on a magnetic field line simulation for the inventive magnet bar underlying the target cylinder, as shown for example in FIG. 4. A two parameter best fit extending for ten units of length, l and a normalized thickness of unity for an inventive erosion profile has values for $D_f$ of between 0.01 and 0.3 and $l_f$ of greater than 1 and in particular between 1.1 and 2.0.

Any patents or publications mentioned in this specification are indicative of the levels of those skilled in the art to which the invention pertains. These patents and publications are herein incorporated by reference to the same extent as if each individual publication was specifically and individually indicated to be incorporated by reference.

One skilled in the art will readily appreciate that the present invention is well adapted to carry out the objects and obtain the ends and advantages mentioned, as well as those inherent therein. The present methods, procedures, treatments, molecules, and specific compounds described herein are presently representative of preferred embodiments, are exemplary, and are not intended as limitations on the scope of the invention. Changes therein and other uses will occur to those skilled in the art which are encompassed within the spirit of the invention as defined by the scope of the claims.

We claim:

1. A process of coating a substrate comprising:
   energizing a tubular target formed of a tube material and having a tube end affixed to a tubular cathode under conditions to generate a sputtering racetrack-shaped plasma extending towards the substrate;
   arranging a plurality of magnets inside said cathode to form a magnetic field which interacts with a racetrack-shaped plasma source aligned with said target, said plasma source having two straight portions and at least one terminal turnaround portion connecting said straight portions to move an erosion zone on said tubular target aligned with at the least one terminal turnaround toward the end of said target as said target is utilized to deposit the coating on the substrate;
   wherein a portion of said target defining said end forms a flange intersection at said erosion zone at an angle β of between 70 and 90 degrees at a termination of an operable lifetime for said target.

2. The process of claim 1 wherein said erosion zone shifts toward the end as said target is sputtered and away from said straight portions.

3. The process of claim 1 wherein said erosion zone shifts away from a normal line to a target initial surface by an angle Θ of up to 70 degrees.

4. The process of claim 1 wherein said target is utilized to between 70 and 87 weight percent the target material.

* * * * *